United States Patent
Lyu et al.

(10) Patent No.: US 7,512,166 B2
(45) Date of Patent: Mar. 31, 2009

(54) APPARATUS AND METHOD FOR CONTROLLING OPTICAL POWER AND EXTINCTION RATIO

(75) Inventors: Gap Youl Lyu, Irvine, CA (US); Kilhun Koo, Irvine, CA (US); Min Hee Kang, Irvine, CA (US)

(73) Assignee: Raybit Systems, Santa Ana, CA (US)

( * ) Notice: Subject to any disclaimer, the term of this patent is extended or adjusted under 35 U.S.C. 154(b) by 19 days.

(21) Appl. No.: 11/565,768

(22) Filed: Dec. 1, 2006

(65) Prior Publication Data

US 2008/0128587 A1    Jun. 5, 2008

(51) Int. Cl.
*H01S 3/00* (2006.01)
(52) U.S. Cl. ............... 372/38.1; 372/38.02; 372/38.07
(58) Field of Classification Search ............ 372/38.1, 372/38.02, 38.07
See application file for complete search history.

(56) References Cited

U.S. PATENT DOCUMENTS 5,502,298 A    3/1996   Geller
6,414,974 B1   7/2002   Russell et al.
2002/0009109 A1*  1/2002   Asano .................. 372/38.02

* cited by examiner

*Primary Examiner*—Dung T Nguyen

(57) ABSTRACT

The present invention relates to an optical power and extinction ratio controlling device and method. An optical signal output from a light source is detected and optical power and extinction ratio of the light source are controlled. In detail, a feedback signal is provided to the light source to automatically control the bias current based on a DC signal output by a photodetector detecting the optical signal. Therefore, the optical output of the light source is maintained. Also, an optical signal output by the photodetector is converted into a predetermined times DC signal, and a feedback signal is provided to the light source to automatically control the modulation current based on the DC signal. Therefore, the extinction ratio of the light source is maintained. As a result, the extinction ratio is automatically maintained to satisfy the change of condition and the characteristic of light source, thereby maintaining quality optical outputs.

12 Claims, 5 Drawing Sheets

APPARATUS AND METHOD FOR CONTROLLING OPTICAL POWER AND EXTINCTION RATIO

BACKGROUND OF THE INVENTION (a) Field of the Invention

The present invention relates to an optical controller. More particularly, the present invention relates to a device and method for automatically controlling optical power provided by a light source, and an optical extinction ratio (ER).

(b) Description of the Related Art

In a general optical communication network, it is required to maintain outputs and an extinction ratio (an intensity ratio of the minimum transmission light and the maximum transmission light) of a laser diode and an optical transmitter that are determined according to data rates and transmission distances in order to provide quality optical signal transmission. The laser diode generally used as a light source in the optical communication starts being oscillated when a current of more than a threshold current is applied at a predetermined temperature, and the optical output of the laser diode is linearly increased as the applied current value is increased. A bias current is applied at the oscillation in order to maintain the average optical output of the laser diode, and a modulation current is applied in order to maintain a predetermined extinction ratio.

The optical output/current characteristic curve of the laser diode is variable depending on the temperature and the aging of the laser diode. FIG. 1 shows a graph for an optical output/current characteristic curve for a general laser diode. In FIG. 1, Ib is a bias current value, and Im is a modulation current value. P0 is an optical output value of the laser diode when the bias current is applied only, and P1 is an optical output value when the modulation current is applied. Also, Pav is an average optical output value, which is an average of P0 and P1. In this instance, the extinction ratio is defined by Equation 1.

$$ER = 10\ \log(P1/P0)[dB] \qquad \text{(Equation 1)}$$

Referring to FIG. 1, the optical output/current characteristic curve for the laser diode varies according to the temperature. In detail, when a predetermined modulation current is applied to the laser diode so as to acquire a desired extinction ratio with reference to the optical output/current characteristic curve at room temperature (e.g., 25° C.), the slope of the optical output/current characteristic curve varies even under the same conditions when the laser diode has a high temperature (e.g., 85° C.). As a result, the high temperature has less optical output value, thus reducing the extinction ratio. The reduction of the extinction ratio influences the power penalty in the optical communication to reduce the maximum transmission distance.

Therefore, it is required to maintain the extinction ratio so as to provide optimized optical communication, and it is needed to control the amplitude of the modulation current and that of the bias current according to the optical output/current characteristic curve.

In general, in order to maintain the extinction ratio, the modulation amplitude is controlled as follows.

The first method is to find characteristic values of the optical output/current characteristic curve depending on the temperature changes of the laser diode, storing an optimized modulation amplitude into a lookup table based on the characteristic values, and controlling the modulation amplitude based on the lookup table. In this instance, when the temperature of the laser diode is changed, corresponding modulation amplitude is read from the lookup table and is then fed back to the laser diode.

However, in this case, the modulation amplitude is determined according to the temperature change from the characteristic value for the optical output/current characteristic curve of the laser diode, and hence, there is a restriction on establishing in detail the difference of characteristic changes caused by the optical output/current characteristic curve and temperature change that are slightly different for respective laser diodes.

Also, there are many restrictions to changing the lookup table, the data of which are statistically processed so as to acquire the desired extinction ratio when considering the costs caused by measurement and control, and time. Therefore, the problem is that the lookup table is only applied to the laser diodes having characteristic values of a similar optical output/current characteristic curve. Further, it is needed to individually change driving circuits of the laser diodes in order to change the optical output/current characteristic curves according to the temperature for the respective laser diodes.

The second method is to apply a pilot tone signal having a predetermined measurement frequency to the original signal output by the laser diode to sense an error signal, and controlling the feedback of the modulation current of the laser diode based on the sensed error signal.

However in the above-noted second method, a circuit for applying the pilot tone signal is added so that the whole circuit structure becomes more complicated and jitter caused by applying the pilot tone signal is increased. Also, since the optical output/current characteristic curve is non-linearly changed at high temperature (e.g., 85° C.), the amplitude of the applied pilot tone signal is reduced. Therefore, the modulation current is increased so as to correct the reduction thereof, and as a result, the temperature of the laser diode is further increased so that normal operation is not performed.

As described above, the conventional manual extinction ratio controlling method and the pilot tone based extinction ratio controlling method fail to control the current by applying different optical output/current characteristics according to the temperature changes of the respective laser diodes. Therefore, when the laser diode is used at a high temperature or a low temperature, errors occur to deteriorate communication quality of the communication system and generate substantial communication problems.

SUMMARY OF THE INVENTION

The present invention has been made in an effort to provide a device and a method for controlling the optical power and extinction ratio for each light source in an optimized manner. The present invention has been made in another effort to provide a device and a method for automatically controlling the optical power of a light source variable by temperature or aging, and providing an optimized optical output characteristic.

The present invention has been made in another effort to provide a device and a method for automatically sensing a change of the optical output/current characteristic curve caused by temperature change and aging when a desired extinction ratio value for the light source is established once at any temperature, and actively and accurately controlling the modulation amplitude and optical power applied to the light source within an allowable range.

In one aspect of the present invention, a device for controlling optical power of a light source and an extinction ratio includes: a photodetector for detecting the light output by the light source and outputting a first detection signal and a second detection signal; a light source driver for supplying a bias current and a modulation current to the light source; a signal converter for converting the first and second detection signals into voltage signals; and a controller for controlling the bias current based on the first detection signal converted into the voltage signal and controlling the modulation current based on the second detection signal converted into the voltage signal, wherein the first detection signal is a signal corresponding to the light output by the light source driven by the bias current, and the second detection signal is a signal corresponding to the light output by the light source driven by the modulation current.

In another aspect of the present invention, a device for controlling optical power of a light source and an extinction ratio includes: an external modulator for modulating and outputting the light output by the light source according to an applied modulation current; a modulator driver for supplying a modulation current to the external modulator; a light source driver for supplying a bias current to the light source; a photodetector for detecting the light output through the external modulator and outputting a first detection signal and a second detection signal; a signal converter for converting the first and second detection signals into voltage signals; and a controller for controlling the bias current based on a first detection signal converted into the voltage signal and controlling the modulation current based on a second detection signal converted into the voltage signal, wherein the first detection signal is a signal corresponding to the light output by the light source driven by the bias current, and the second detection signal is a signal corresponding to the light output by the light source driven by the modulation current. The first detection signal is a signal corresponding to average power of the light output by the light source driven by the bias current, and the second detection signal is a signal corresponding to an alternating current (AC) signal of the light output by the light source driven by the modulation current.

The controller includes: an automatic power control (APC) unit for monitoring and controlling a bias current based on the first detection signal and controlling the optical power following the first detection signal to satisfy a first establishing value; and an automatic extinction ratio control (AEC) unit for monitoring and controlling a modulation current based on the second detection signal, and generating and controlling the extinction ratio following the first and second detection signals to satisfy a second establishing value.

In another aspect of the present invention, a method for controlling optical power of a light source and an extinction ratio includes: detecting the light output by a light source driven by an applied bias current and generating a first electrical detection signal; detecting the light output by a light source driven by an applied modulation current and generating a second electrical detection signal; controlling the bias current so that the optical power following the first detection signal may satisfy a first establishing value; and controlling the modulation current so that the extinction ratio following the first and second detection signals may satisfy a second establishing value.

DETAILED DESCRIPTION OF THE EMBODIMENTS

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive.

Throughout this specification and the claims which follow, unless explicitly described to the contrary, the word "comprising" and variations such as "comprises" will be understood to imply the inclusion of stated elements but not the exclusion of any other elements.

Figure 1:
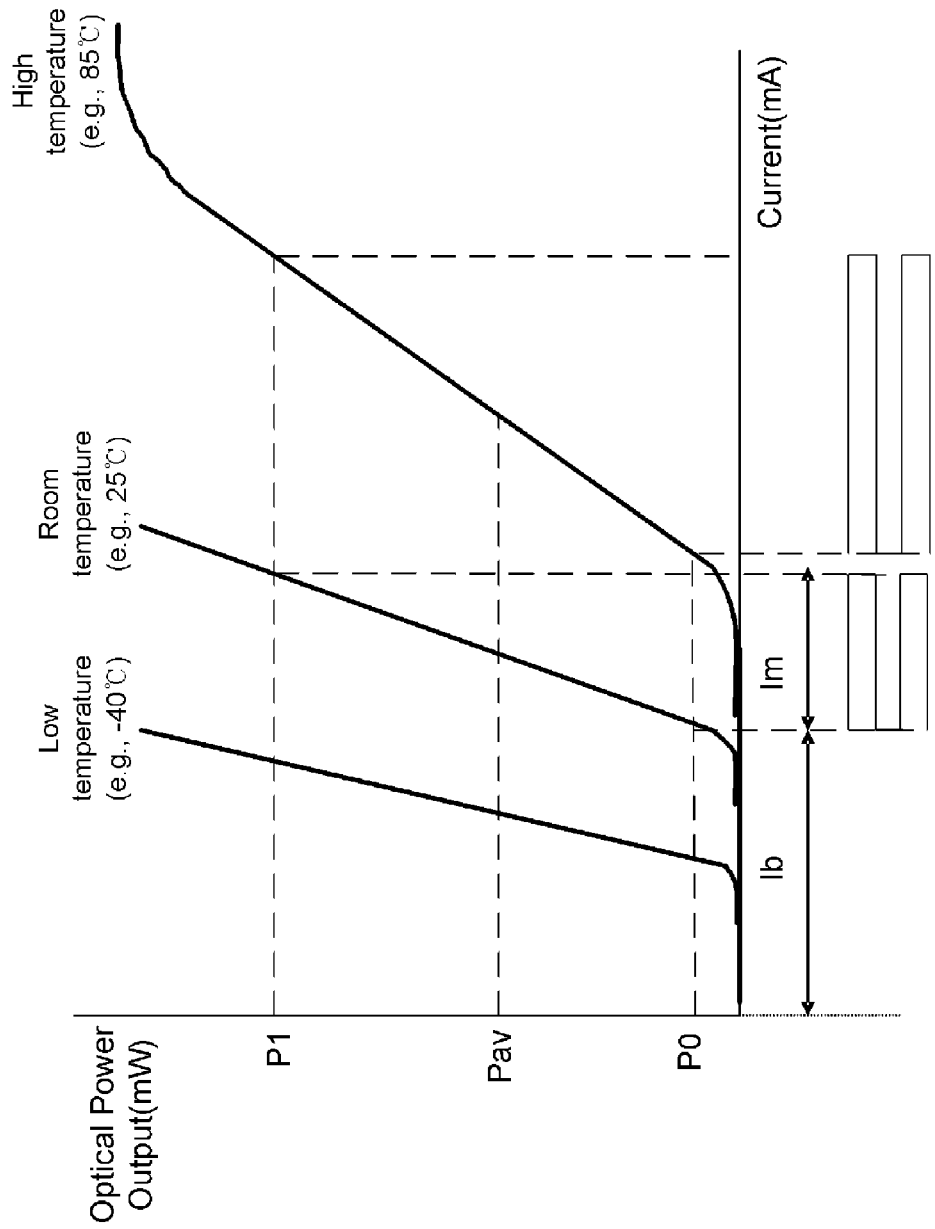
FIG. 1 shows a graph for an optical output/current characteristic curve of a general laser diode.
Figure 2:
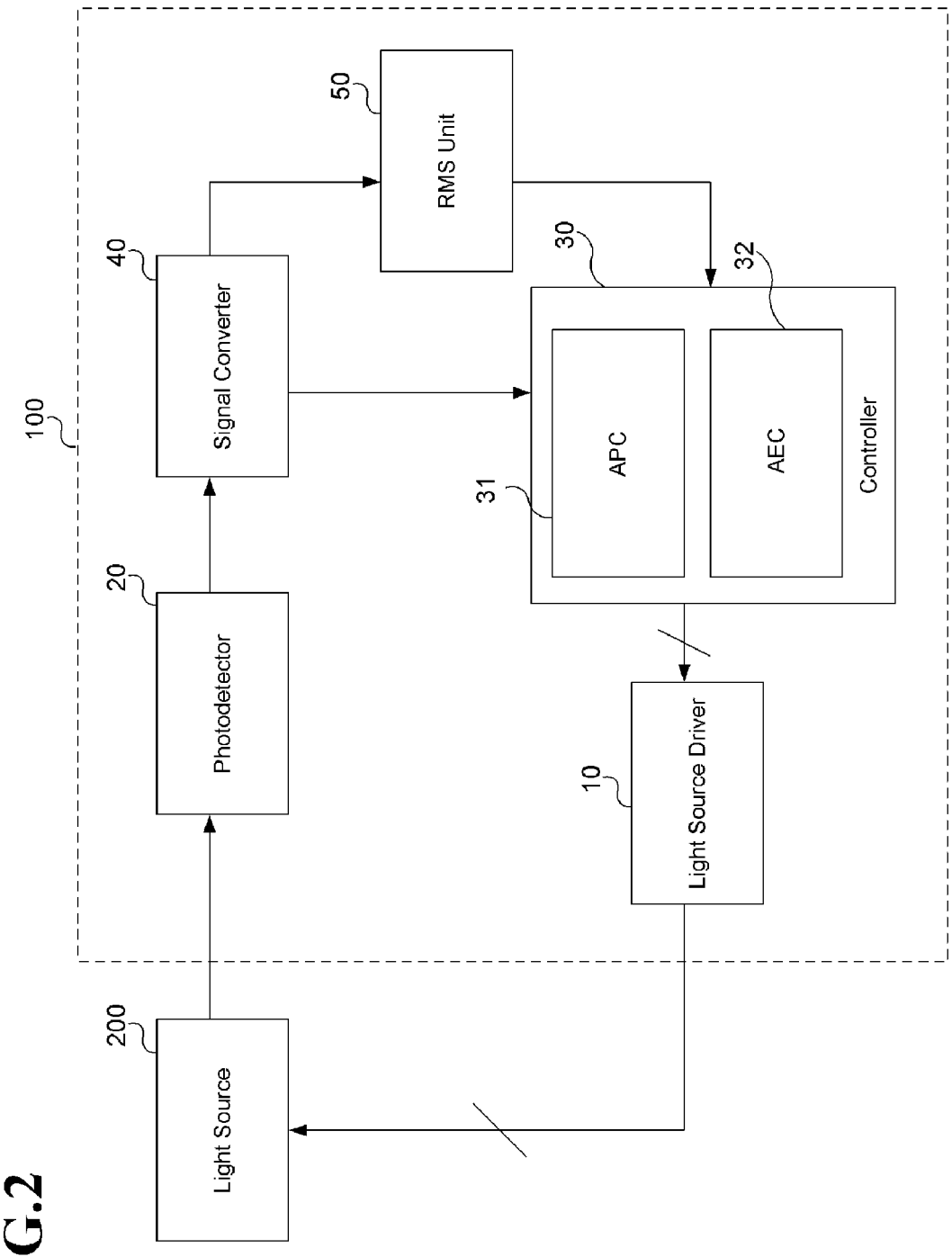
FIG. 2 shows a schematic diagram for an optical power and extinction ratio control device according to a first embodiment of the present invention.

FIG. 2 shows a configuration diagram for an optical power and extinction ratio control device according to a first embodiment of the present invention. For better comprehension and ease of description, the optical power and extinction ratio control device according to the embodiment of the present invention will be referred to as an optical control device.

An optical control device 100 controls the current applied to a light source 200 based on the light output by the light source 200 so as to maintain the optical power and extinction ratio, as shown in FIG. 2.

For this purpose, the optical control device 100 includes a light source driver 10 for supplying a current to the light source 200, a photodetector 20 for detecting the light output by the light source 200 and outputting a corresponding electrical signal, a controller 30 for controlling the light source driver 10 based on the detected light, and a signal converter 40 for converting the signal output by the photodetector into a signal available by the controller and outputting the signal, and it further includes an RMS unit 50 for performing a root mean square (RMS) operation on the signal output by the signal converter 40 and outputting a resultant signal to the controller 30. A laser diode is used for the light source 200, and the RMS unit 50 includes a wideband RMS unit. However, the present invention is not restricted to this configuration.

The optical control device 100 controls the optical power of the light source 200 based on the DC component amplitude of the light detected by the photodetector 20, and controls the extinction ratio of the light source 200 based on the DC component amplitude of the light detected by the photodetector 20. The configuration of the optical control device 100 will now be described in further detail.

Figure 3:
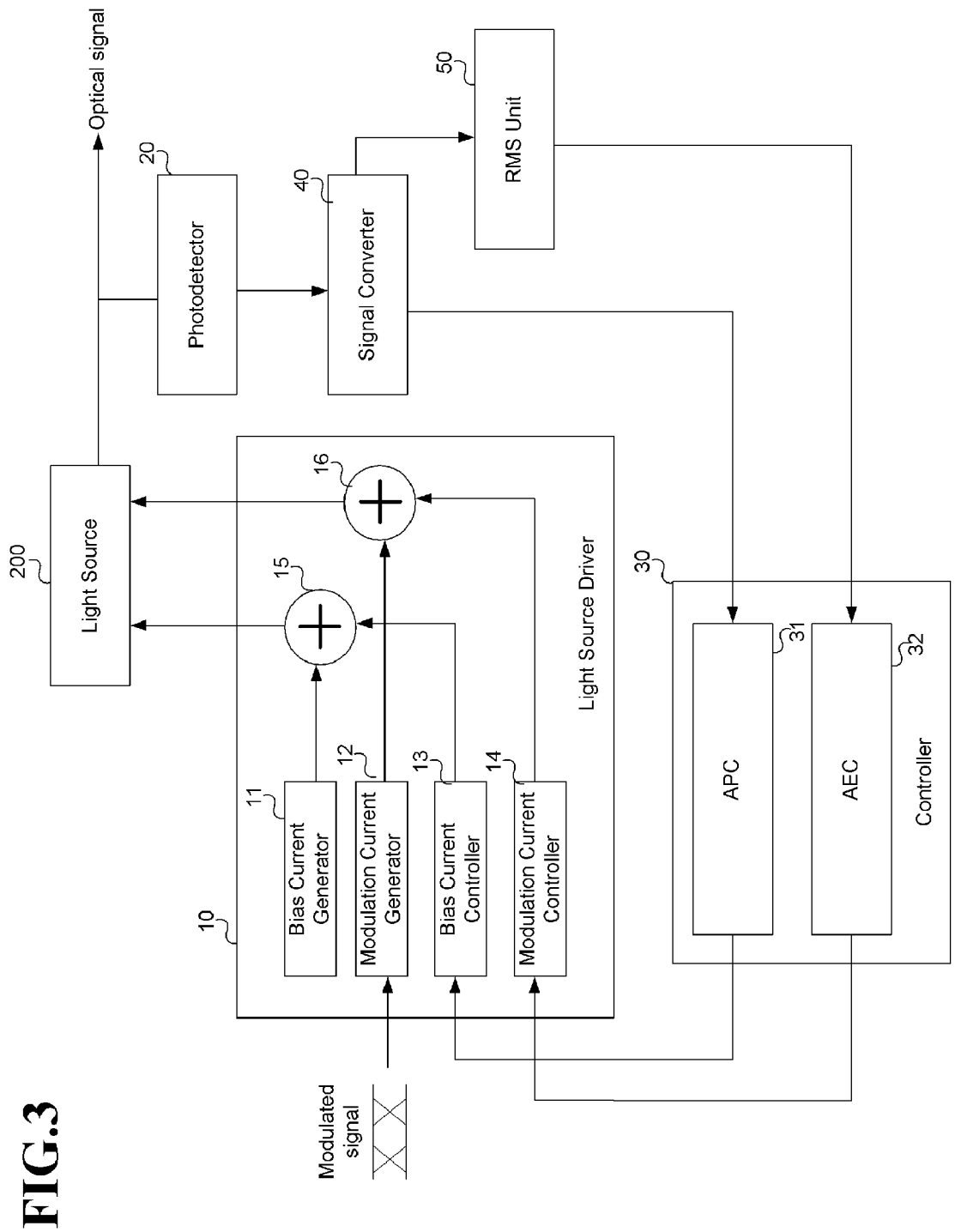
FIG. 3 shows a detailed configuration diagram for a light source driver shown in FIG. 2.

FIG. 3 shows a detailed schematic diagram for the light source driver 10 of the optical control device 100.

The light source driver 10 supplies a bias current and a modulation current to the light source 200, and for this purpose, as shown in FIG. 3, the light source driver 10 includes a bias current generator 11, a modulation current generator 12 for generating a modulation current based on an external modulation signal, a bias current controller 13 for generating a first control current for controlling the bias current according to a control signal applied by the controller 30, and a modulation current controller 14 for generating a second control current for controlling the modulation current according to a control signal applied by the controller 30. The light source driver 10 further includes a first adder 15 for adding a first control current to the bias current output by the bias current generator 11 and supplying the added current to the light source 200, and a second adder 16 for adding a second control current to the modulation current output by the modulation current generator 12 and supplying the added current to the light source 200.

The light source driver 10 has been divided into a plurality of components depending on the functions, and the light source driver 10 can be realized in various manners without being restricted to the above-described divided configuration. For example, a bias current supply for supplying the bias current controlled by the control signal as a final light source can be realized by combining the bias current generator 11, the bias current controller 13, and the first adder 15. Also, a modulation current supply for supplying the modulation current controlled by the control signal as a final light source can be realized by combining the modulation current generator 12, the modulation current controller 14, and the second adder 16.

The light source 200 is driven by the current supplied by the light source driver 10, and outputs predetermined light, particularly, it outputs a first optical signal according to the bias current and outputs a second optical signal according to the modulation current. The photodetector 20 detects the power of optical signals output by the light source 200, and outputs respective signals corresponding to the detected power. For example, the photodetector 20 detects the first and second optical signals and outputs corresponding first and second detection signals (e.g., P0 and P1).

In general, a communication laser has a PIN photodiode (PD) for detecting optical signals. The PIN PD has a function of converting a high frequency optical signal into a DC signal and outputting the DC signal, and it is needed to match the PIN PD according to general high frequency impedance matching, for example, 50 Ω. If not, noise caused by the high frequency impedance mismatching within the PIN PD influences the optical signal to deteriorate communication performance. Therefore, the photodetector 20 may have the above-noted impedance matching function. Accordingly, the photodetector 20 can be used for impedance matching as well as photodetection. Also, the photodetector 20 can be realized to be included in the light source 200, or can be realized to be separated from the light source 200.

The signal converter 40 converts a detection signal corresponding to the optical power detected by the photodetector 20 into a predetermined signal and outputs the predetermined signal. That is, the signal converter 40 outputs the detection signals as corresponding voltage signals. Particularly, the signal converter 40 DC couples the detection signal and outputs a corresponding DC voltage signal, and AC couples the detection signal and outputs a corresponding AC voltage signal. For example, a first detection signal corresponding to a first optical signal output according to a bias current is DC coupled to be output as a DC voltage signal, and a second detection signal corresponding to a second optical signal output according to a modulation current is AC coupled to be output as an AC voltage signal. A circuit using a low pass filter or a high pass filter, or a bias tee can be used for the circuit for AC coupling and DC coupling in the signal converter 40. The above-noted circuit is well known to a person skilled in the art and so no corresponding detailed description will be provided.

The root mean square (RMS) unit 50 receives an AC voltage signal AC coupled and applied by the signal converter, adds a constant times DC signal to the AC voltage signal, and outputs a resultant signal. That is, the RMS unit 50 selects a DC voltage signal having the same energy as that of the value that is generated by performing an RMS operation on the input AC voltage signal, integrating a corresponding resultant signal, and taking an average value thereof, and then outputs the selected DC voltage signal. The signal output by the RMS unit 50 is given as follows.

$$Vout = C*Vinrms \quad \text{(Equation 2)}$$

Where, Vinrms is the amplitude of the signal input to the RMS unit 50, C is a constant, and Vout is the amplitude of the signal output by the RMS unit 50.

The signal output by the RMS unit 50 is proportional to the input signal that is the amplitude of the AC voltage signal, and in detail, it is proportional to the ratio of the amplitudes of P0 and P1. Therefore, the controller 30 maintains the extinction ratio by maintaining the P1/P0 values based on the amplitude of the AC voltage signal.

Figure 4:
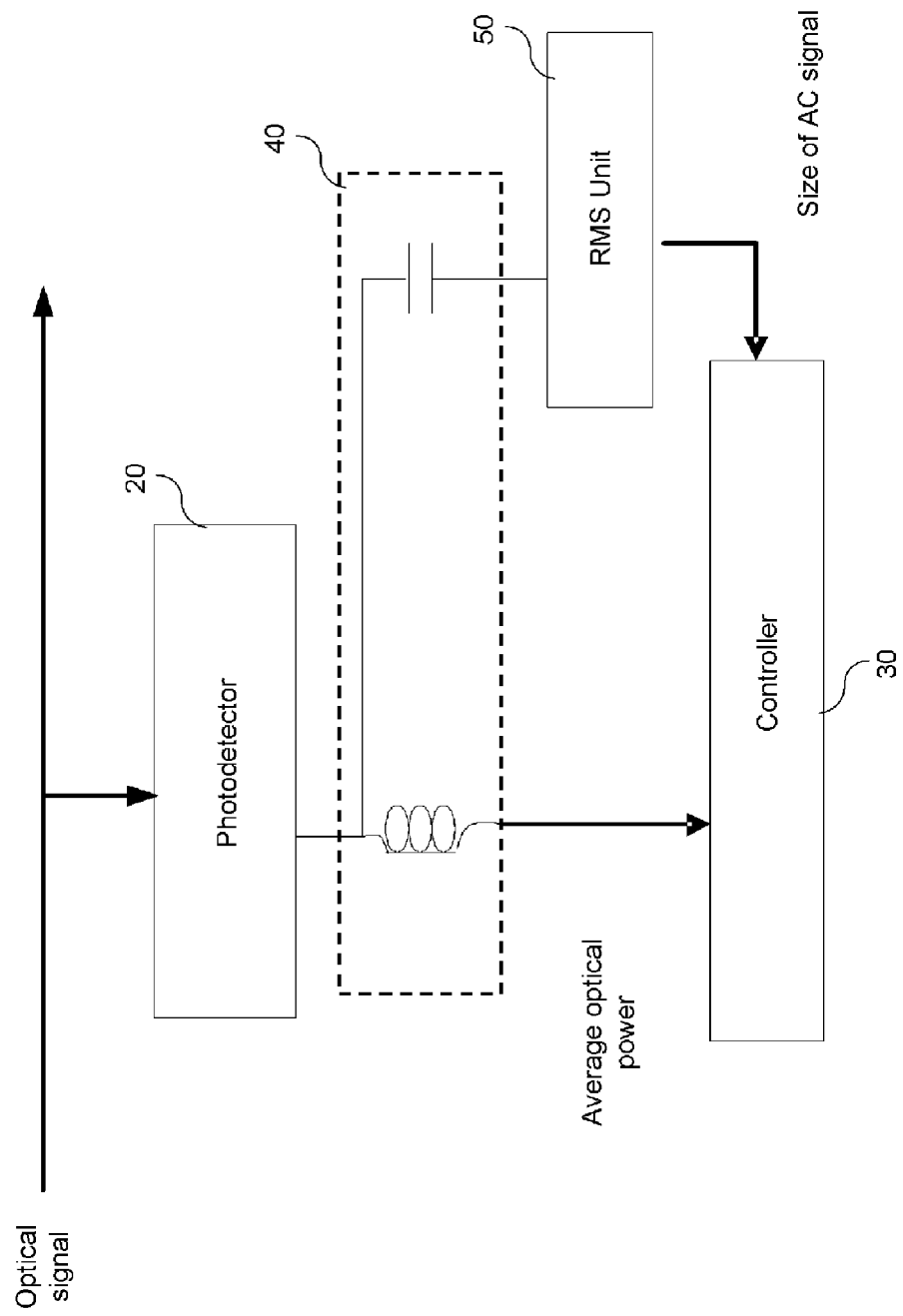
FIG. 4 shows a detailed configuration diagram for a signal converter shown in FIG. 2.

FIG. 4 shows a signal processing state of the signal converter and the RMS unit. Referring to FIG. 4, the first detection signal is DC coupled by the signal converter 40 to be output as a DC voltage signal, and the DC voltage signal is input to the controller 30. The second detection signal is AC coupled by the signal converter 40 to be output as an AC voltage signal, and the AC voltage signal is output as a constant times DC voltage signal by the RMS unit 50, and the DC voltage signal is input to the controller 30. The DC voltage signal DC coupled and output by the signal converter 40 represents average optical power of the light source, and the DC voltage signal output by the RMS unit 50 indicates the amplitude of the AC signal detected by the photodetector 20. Since the signal output by the photodetector 20 is converted into a predetermined DC voltage signal by the signal converter and the RMS unit, the signal converter 40 can be referred to as a first signal converter and the RMS unit 50 can be referred to as a second signal converter.

The controller 30 calculates amplitudes of an appropriate bias current and a modulation current based on the amplitudes of the DC voltage signal for automatically controlling an optical output and the AC voltage signal for automatically controlling the extinction ratio detected by the photodetector 20, and controls the current supplied to the light source 200 based on the calculated amplitudes. For this purpose, as shown in FIG. 3, the controller 30 includes an automatic power control (APC) unit 31 for controlling the current supplied to the light source, monitoring the current supply, and maintaining a constant optical output, and an automatic extinction ratio control (AEC) unit 32 for controlling the current supplied to the light source, monitoring the current supply, and maintaining a constant extinction ratio.

The APC unit 31 senses the change of the optical power variable by the temperature based on the DC component detection signal of the photodetector 20 provided through the signal converter 40, and controls the bias current value so as to maintain the optical output of the light source. In detail, the APC unit 31 calculates the bias current based on the average optical power measured through the signal converter 40, generates a control signal for controlling the bias current according to the calculated current of the light source driver 10. Also, the APC unit 31 has a function for controlling the optical power within an allowable range so as to maintain the extinction ratio at a high temperature greater than an established temperature.

The AEC unit 32 monitors in real-time the DC voltage signal output by the RMS unit 50, and controls the modulation current based on the monitored signal so as to maintain the P1/P0 ratio that is the extinction ratio. In detail, the extinction ratio is calculated by using the average optical power measured by the signal converter 40 and the AC signal amplitude measured by the RMS unit 50, and the AEC unit 32 generates a control signal for controlling the modulation current according to the calculated extinction ratio of the light source driver 10. In this case, the APC unit 31 and the AEC unit 32 are realized to be included in the controller 30 that can be realized to be a microprocessor, or alternatively the same can be realized individually.

An operation by an optical control device according to an embodiment of the present invention will now be described.

The optical control device 100 establishes an optimized optical power and an extinction ratio at any temperature, and stores the established values in the APC unit 31 and the AEC unit 32 of the controller 30 so that the established values may be used as reference values for subsequently controlling the optical power and the extinction ratio.

When a predetermined current is applied to the light source 200 from the light source driver 10 in order to drive the light source 200, the light source 200 is driven by the applied current to output predetermined light. In detail, the bias current generator 11 supplies a predetermined bias current having an established value to the light source 200, and the modulation current generator 12 is operated by the applied modulation signal to supply a modulation current having a predetermined value to the light source 200.

The photodetector 20 detects a first optical signal output by the light source 200 operable by the bias current and outputs a corresponding first detection signal, that is, P0, and detects a second optical signal output by the light source 200 operable by the modulation current, and outputs a second detection signal, that is, P1.

The first detection signal has a DC component since it is a signal corresponding to the first optical signal output according to the bias current, and hence, as shown in FIG. 4, the first detection signal is directly input to the controller 30 through the signal converter 40. The APC unit 31 of the controller 30 determines the optical power of the current light source based on the converted and input first detection signal, and compares the determined optical power and the optical power established to be a reference value. The APC unit 31 generates a first control signal for controlling the measured optical power of the light source to correspond to the established optical power according to the comparison result, and outputs the first control signal to the bias current controller 13. Therefore, the bias current controller 13 generates a first control current according to the first control signal, and the first adder 15 adds the generated first control current and the bias current output by the bias current generator 11 and supplies the added result to the light source 200. As a result, the bias current controlled according to the detected optical power is supplied to the light source 200, and the optical power of the light source 200 is controlled to maintain the established optical power.

The second detection signal is converted into a voltage signal by the signal converter 40, the voltage signal is converted into a DC voltage signal by the RMS unit 50, and the DC voltage signal is input to the controller 30. The second detection signal has an AC component since it is a signal corresponding to the second optical signal output according to the modulation current, and hence, the second detection signal is not directly input to the controller 30 through the signal converter 40 but is input to the RMS unit 50, as shown in FIG. 4. Therefore, the RMS unit 50 converts the input AC voltage signal into a predetermined times DC voltage signal and outputs the DC voltage signal, and the controller 30 controls the extinction ratio based on the input DC second detection signal. That is, the AEC unit 32 determines the extinction ratio of the current light source based on a second detection signal converted and input as described above, and compares the determined extinction ratio and the extinction ratio established to be a reference value. The AEC unit 32 generates a second control signal for controlling the extinction ratio of the measured light source to correspond to the established extinction ratio according to the comparison result, and outputs the second control signal to the modulation current controller 14. Therefore, the modulation current controller 14 generates a second control current according to the second control signal, and the second adder 16 adds the generated second control current and the modulation current output by the modulation current generator 12 and supplies the resultant current to the light source 200. As a result, the modulation current controlled according to the detected extinction ratio is supplied to the light source 200, and the extinction ratio of the light source 200 is maintained at the established optical power.

According to the above-described operation, the changed optical power caused by the temperature change is sensed based on the optical power output by the light source, and the optical power and the extinction ratio of the light source are automatically controlled according to the sensing result so that a good optical output characteristic is maintained.

Further, when the extinction ratio is established at any temperature, the change of the optical output/current characteristic curve caused by the temperature change and aging is automatically sensed, and hence, the modulation amplitude is actively and accurately controlled so as to maintain the extinction ratio.

An optical control device according to a second embodiment of the present invention will now be described.

It is described in the first embodiment that the optical power output by the light source and the extinction ratio are controlled when the light source is operated by the supplied modulation current to output corresponding light, and it will be described in the second embodiment that the optical power and the extinction ratio are controlled by connecting a means for modulating the light to an output terminal of the light source when the light output by the light source is modulated and output. The means, connected to the output terminal of the light source, for modulating the output light will be referred to as an external modulator.

Figure 5:
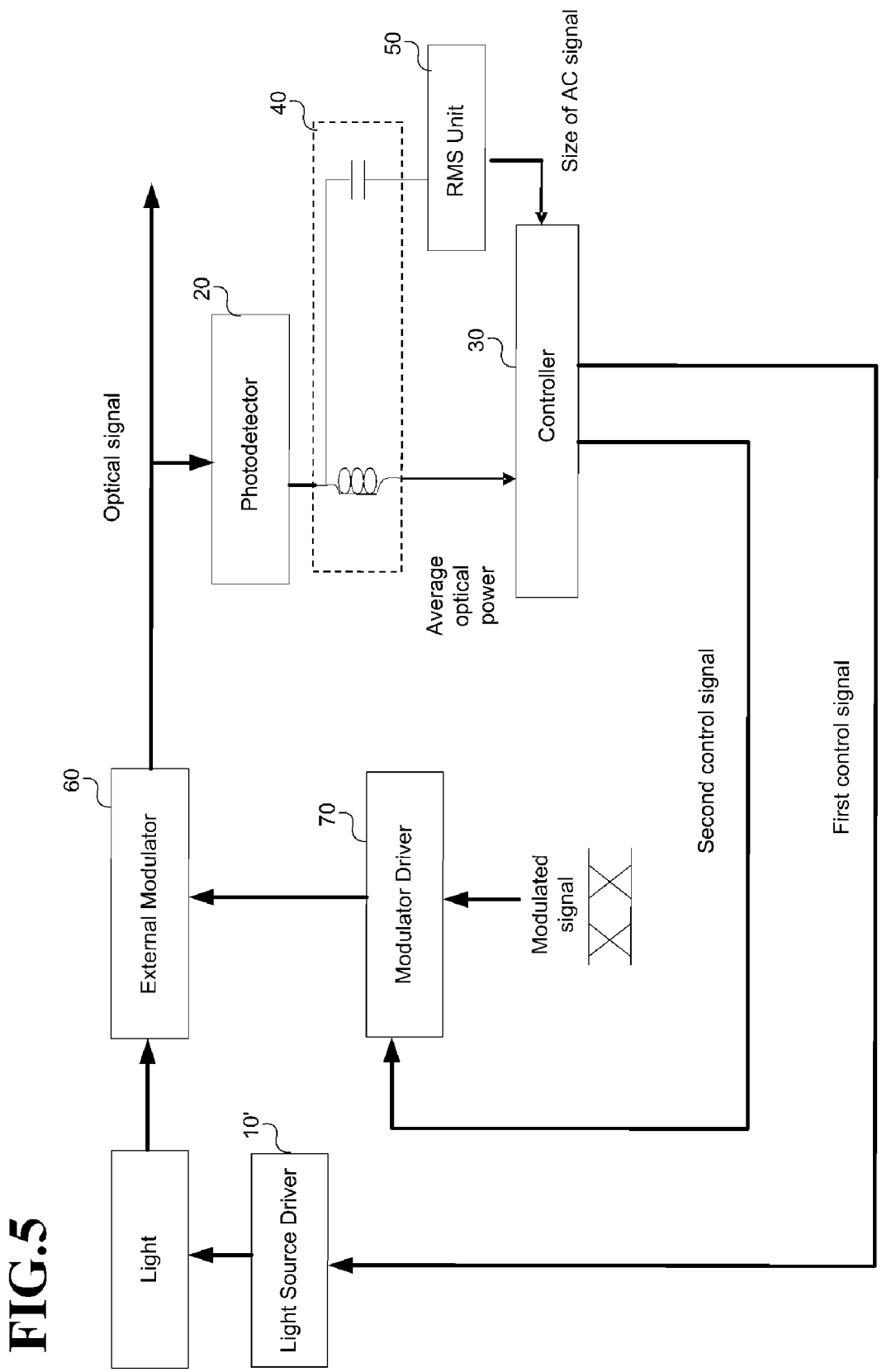
FIG. 5 shows a configuration diagram for an optical power and extinction ratio control device according to a second embodiment of the present invention.

FIG. 5 shows a configuration diagram for an optical control device according to a second embodiment of the present invention. The constituent elements performing the same functions as those of the first embodiment have the same reference numerals as in the first embodiment, and functions performed in the same manner are not described.

As shown in FIG. 5, the optical control device 100 includes a photodetector 20, a signal converter 40, an RMS unit 50, a controller 30 including an APC unit 31 and an AEC unit 32 in a like manner of the first embodiment. Differing from the first embodiment, the optical control device 100 according to the second embodiment further includes an external modulator 60 for modulating the optical signal output by the light source 200 and outputting the modulated optical signal, and a modulator driver 70 for generating a predetermined modulation current according to a control signal applied by the controller 30 and providing the modulation current to the external modulator 60. In addition, the optical control device 100 may further include a light source driver 10' for supplying a predetermined driving current to the light source 200.

Differing from the first exemplary embodiment, the light source driver 10' supplies a predetermined driving current to the light source 200, and for example, the light source driver 10' supplies a bias current of an established value to the light source 200 and controls the bias current according to control by the controller 30. In detail, the light source driver 10' according to the second embodiment may include a bias current generator for generating a bias current, a bias current generator for generating a first control current according to a first control signal applied by the controller, and a first adder for adding a first control current to the bias current and supplying the resultant current to the light source 200.

The modulator driver 70 generates and outputs a modulation current based on the control signal (particularly, a second control signal output by the controller 30 for controlling the extinction ratio based on the DC signal proportional to the amplitude of the AC signal provided by the RMS unit 50) applied by the controller 30, and particularly, generates and outputs a modulation current according to the applied modulation signal, or controls the modulation signal according to the applied control signal, and generates and outputs a modulation current corresponding to the controlled modulation signal.

The external modulator 60 modulates and outputs the light output by the light source 200, and in detail, it is operated according to the modulation current applied by the modulator driver 70, and modulates and outputs the light. In addition, the external modulator 60 outputs the light output by the light source 200 without modulating the same when no modulation current is provided.

The operation by the optical control device according to the second embodiment of the present invention is performed in a like manner of the first embodiment, and particularly, the operation by the controller 30 for processing the signal that is detected by the photodetector 20 and is then input through the signal converter 40 or the RMS unit 50 and controlling the optical power and the extinction ratio corresponds to that of the first embodiment.

However, differing from the first embodiment for controlling the extinction ratio by controlling the current applied to the light source 200, the modulator driver 70 controls the modulation current according to the second control signal applied by the AEC unit 32 of the controller 30, and the external modulator 60 controls the extinction ratio by modulating the light output by the light source 200 according to the controlled modulation current in the second embodiment of the present invention. In a like manner of the first embodiment, the optical power is controlled when the light source driver 10' controls the bias current supplied to the light source 200 according to the first control signal applied by the APC unit 31 of the controller 30.

The external modulator 60 can be realized in various manners in the second embodiment of the present invention. Also, the external modulator 60 may not be included in the optical control device 100 according to the second embodiment of the present invention.

The above-described embodiments of the present invention are operable by detecting the light output by the light source 200, and hence, it is possible to realize an optical control device in the receiver part and measure and control the extinction ratio therein. In this case, it is possible for the receiving part to measure the optical signal states and amplitudes based on the optical control device according to the embodiments of the present invention. The optical control device according to the embodiments of the present invention can be selectively installed and used in either of the receiving part or the transmitting part.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. For example, the light source driver and the controller have been described to be separately realized in the exemplary embodiments, and the controller can be included in the light source driver.

According to the embodiments of the present invention, the optimized optical communication quality can be maintained irrespective of temperature.

Particularly, the extinction ratio of the light source variable by temperature is automatically controlled to provide quality optical output characteristics by concurrently monitoring and automatically controlling the optical power and the extinction ratio.

Also, when the extinction ratio of the light source is established once at any temperature, the change of the optical output/current characteristic curve caused by the temperature change and aging is automatically sensed and the modulation amplitude is accurately controlled so as to maintain the extinction ratio. Therefore, differing from the existing method for manually controlling the extinction ratio, the constant extinction ratio is maintained irrespective of temperature changes, and particularly, the time and cost are saved since there is no need to individually correct the circuit for the light source.

Also, since the extinction ratio is automatically controlled, there is no need to statistically find the characteristic value of the optical output/current characteristic curve depending on the temperature of the light source and store the optimized modulation amplitude in a lookup table, thereby saving time and cost.

Further, differing from the existing manual extinction ratio controlling method having many errors at a high temperature and at a low temperature, a constant extinction ratio is maintained without changes at high temperature and low temperature since the extinction ratio is automatically controlled based on the characteristics of the individual light source.

In addition, differing from the method for controlling the extinction ratio by applying a pilot tone, the circuit is simple, and particularly, no erroneous operation by the light source is generated by substantially increasing the modulation current at a high temperature (e.g., 85° C.). Also, quality optical output characteristics are provided at a high temperature since the extinction ratio is maintained while automatically controlling the optical power within a permissible range. Further, differing from the existing method for changing the lookup table or correcting the circuit and thereby changing the extinction ratio, it is possible to freely establish the desired extinction ratio by using a micro processor, and hence, the extinction ratio is changeable depending on its usage, and as a result, it is easily used for the optical network.

In addition, in the case of using an external modulator, the extinction ratio is measured at the output terminal of the external modulator, and the bias current of the external modulator and the modulation amplitude of the modulation signal amplifier are automatically controlled to have the optimized conditions. As a result, the optimized optical communication quality is maintained irrespective of temperature change.

What is claimed is:

1. A device for controlling optical power of a lightsource and an extinction ratio comprising:
   a photodetector for detecting the light output by the light source and outputting a first detection signal and a second detection signal;
   a light source driver for supplying a bias current and a modulation current to the light source;
   a signal converter for converting the first and second detection signals into voltage signals; and
   a controller for controlling the bias current based on the first detection signal converted into the voltage signal so that the optical power following the first detection signal may satisfy a first establishing value and controlling the modulation current based on the second detection signal converted into the voltage signal so that the extinction ratio following the first and second detection signals may satisfy a second establishing value,
   wherein the first detection signal is a signal corresponding to the light output by the light source driven by the bias current, and the second detection signal is a signal corresponding to the light output by the light source driven by the modulation current.

2. The device of claim 1, wherein the first detection signal is a signal corresponding to average power of the light output by the light source driven by the bias current, and the second detection signal is a signal corresponding to an alternating current (AC) signal of the light output by the light source driven by the modulation current.

3. The device of claim 1, wherein the signal converter DC couples the first detection signal to convert the same into a direct current (DC) voltage signal and outputs the DC voltage signal, and AC couples the second detection signal to convert the same into an AC voltage signal and outputs the AC voltage signal.

4. The device of claim 3, further comprising a root mean square (RMS) unit for adding a predetermined times DC signal to the second detection signal that is the AC voltage signal, and outputting a DC voltage signal having the amplitude corresponding to the AC voltage signal.

5. The device of claim 1, wherein the controller comprises:
   an automatic power control (APC) unit for monitoring and controlling a bias current based on the first detection signal and generating and outputting a first control signal for driving the light source driver so that the optical power following the first detection signal may satisfy the first establishing value; and
   an automatic extinction ratio control (AEC) unit for monitoring and controlling a modulation current based on the second detection signal and generating and outputting a second control signal for driving the light source driver so that the extinction ratio following the first and second detection signals may satisfy the second establishing value.

6. The device of claim 5, wherein the light source driver comprises:
   a bias current generator for generating a bias current;
   a modulation current generator for generating a modulation current based on an external modulation signal;
   a bias current controller for generating a first control current for controlling the bias current according to a first control signal applied by the APC unit;
   a modulation current controller for generating a second control current for controlling the modulation current according to a second control signal applied by the AEC unit;
   a first adder for adding a first control current to a bias current output by the bias current generator and supplying a resultant current to the light source; and
   a second adder for adding a second control current to a modulation current output by the modulation current generator and supplying a resultant current to the light source.

7. The device of claim 4, wherein the controller comprises:
   an automatic power control (APC) unit for monitoring and controlling a bias current based on the first detection signal and generating and controlling the light source driver so that the optical power following the first detection signal may satisfy a first establishing value; and
   an automatic extinction ratio control (AEC) unit for monitoring and controlling a modulation current based on the second detection signal and controlling the light source driver so that the extinction ratio following the first and second detection signals may satisfy a second establishing value.

8. The device of claim 1, wherein the photodetector performs impedance matching on electrical signals corresponding to the light output by the light source and outputs a first detection signal and a second detection signal.

9. The device of claim 8, wherein the photodetector is realized to be included in the light source.

10. A method for controlling optical power of a light source and an extinction ratio comprising:
    detecting the light output by a light source driven by an applied bias current and generating a first electrical detection signal;
    detecting the light output by a light source driven by an applied modulation current and generating a second electrical detection signal;
    controlling the bias current based on the first detection signal so that the optical power following the first detection signal may satisfy a first establishing value; and
    controlling the modulation current based on the second detection signal so that the extinction ratio following the first and second detection signals may satisfy a second establishing value.

11. The method of claim 10, wherein the first detection signal is a DC voltage signal, the second detection signal is an AC voltage signal, and the controlling of the modulation current comprises converting the second detection signal into a DC signal having the amplitude corresponding to the AC voltage signal and using the DC signal.

12. The method of claim 10, wherein the first detection signal is a signal corresponding to average power of the light output by the light source driven by the bias current, and the second detection signal is a signal corresponding to an AC signal of the light output by the light source driven by the modulation current.

* * * * *